United States Patent [19]
Hill

[11] Patent Number: 4,780,673
[45] Date of Patent: Oct. 25, 1988

[54] ACQUISITION AND PROCESSING OF SPIN-ECHO NMR SPECTRA

[75] Inventor: Howard D. W. Hill, Cupertino, Calif.

[73] Assignee: Varian Associates, Inc., Palo Alto, Calif.

[21] Appl. No.: 104,880

[22] Filed: Oct. 5, 1987

[51] Int. Cl.⁴ ......................................... G01R 33/20
[52] U.S. Cl. ..................................... 324/307; 324/312
[58] Field of Search ............... 324/300, 307, 309, 312, 324/313, 314, 321

[56] References Cited

U.S. PATENT DOCUMENTS

| | | | |
|---|---|---|---|
| 3,786,341 | 1/1974 | Anderson et al. | 324/311 |
| 4,614,907 | 9/1986 | Nagayma | 324/312 |
| 4,661,775 | 4/1987 | Kormos | 324/312 |

Primary Examiner—Michael J. Tokar
Attorney, Agent, or Firm—Stanley Z. Cole; Gerald M. Fisher; Edward H. Berkowitz

[57] ABSTRACT

A correction for NMR spin echo spectral data is obtained by adjusting the time origin of an extended density data set and transforming the adjusted origin data set of original density to the frequency domain.

3 Claims, 2 Drawing Sheets

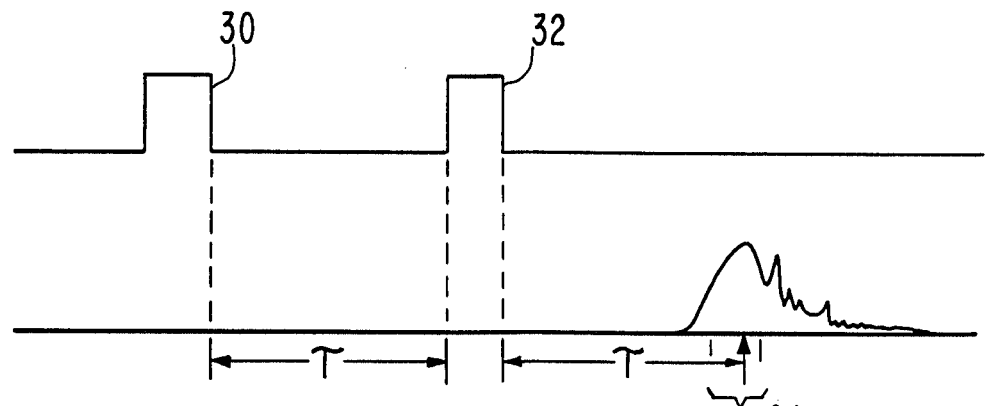
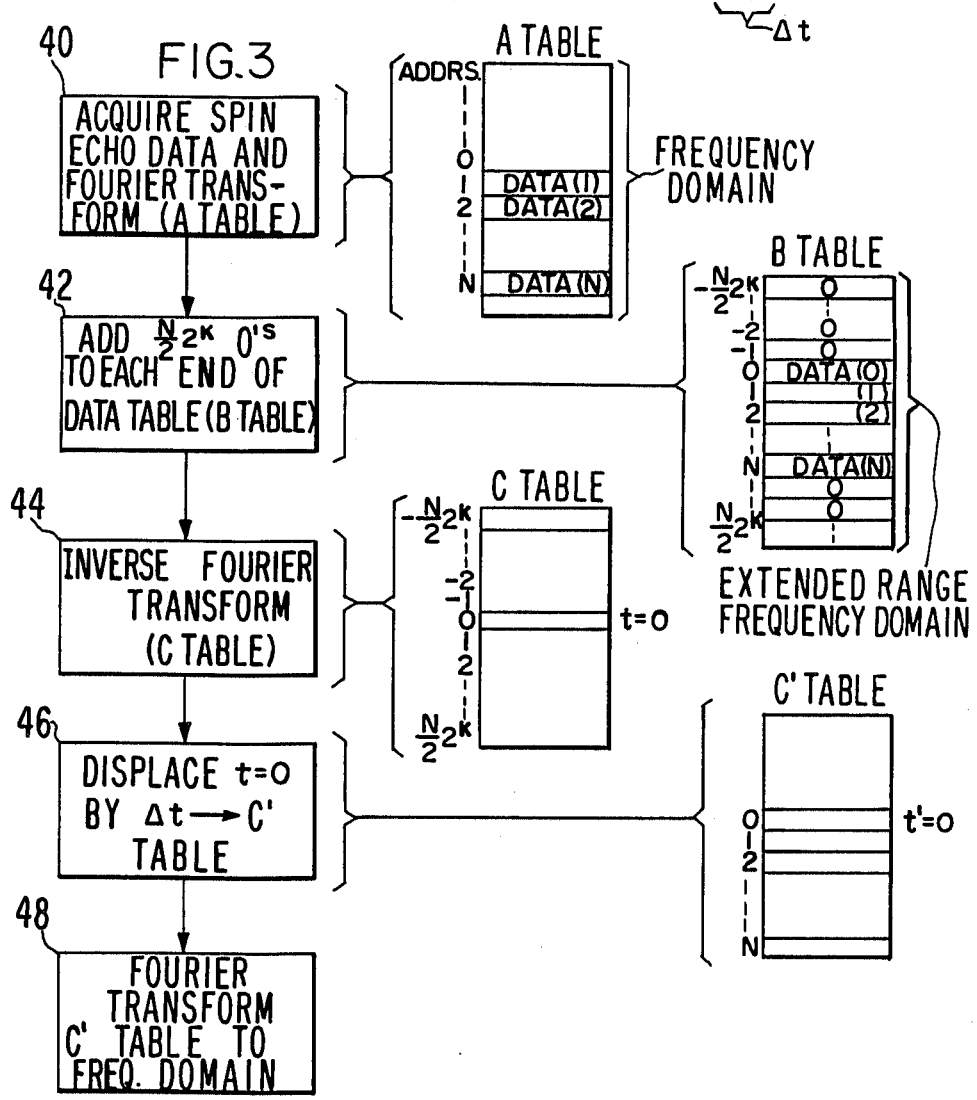

ACQUISITION AND PROCESSING OF SPIN-ECHO NMR SPECTRA

FIELD OF THE INVENTION

The present invention is in the field of nuclear magnetic resonance and more particularly relates to the analytical treatment of spectral line shapes.

BACKGROUND OF THE INVENTION

The investigation of spectral distributions commonly entails the determination of a peak location in the independent variable and the intensity or area associated with the peak. This intensity is most frequently estimated on the basis of the peak amplitude for crude purposes, but an integral of the feature, e.g. peak, is required for serious quantitative study. Precise interpretation necessitates knowledge of the line shape for the purpose of resolving the spectral feature from background or from inferring the presence of complex structure otherwise unresolved. Thus, the investigation of spectral shape of a particular feature presupposes that the spectrometer does not introduce distortion contributing to the observed line shape.

A number of techniques are known to minimize or avoid spectral distortion. For example, it is common practice to detect echo signals rather than free-induction decay signals to avoid problems introduced by receiver dead times in close proximity to pulses. It is also known that data acquisition, if initiated from the peak of the echo signal, will result in a spectrum in the frequency domain, free from distortion and therefore no frequency dependent phase shift will occur across the spectrum and the absorption mode signal will faithfully represent the true line shape.

In the prior art a "successive approximation" technique is known wherein the transformed spectrum is analyzed to search for a frequency dependent phase correction, $\Delta\phi(\omega)$ There is an implied time interval, $\pm\Delta t$, by which the data acquisition is advanced/retarded for another, subsequent data acquisition. This technique may require repetition of the experiment, an extremely time consuming approach when weak signals are observed and many excitations are required to produce an acceptable averaged s/n parameter. Alternatively, the data set acquired to represent the echo signal may be truncated by a small number of points provided the remaining data set spans signal. An example of this technique is to be found in Davis, et al, Chem. Phys. Lett., V. 42, pp. 390-394 (1976).

In a variation of this approach, post acquisition processing may include a simple shift of the time origin through linear interpolation of the original data set. Ronemus, et al., J. Mag. Res., V. 70, pp 416-426 (1986).

Another approach practiced in the prior art is to begin data acquisition early with respect to the echo peak and adjust the data set by associating a particular data point with the time origin corresponding to the echo peak. It is necessary in this method to sample the waveform with a frequency sufficiently high enough to locate the peak with the desired precision, whereas the sampling rate necessary to characterize the waveform may be much lower. Consequently, a correspondingly high speed (and expensive) ADC will be needed for the high sampling rate, while this may be unnecessary for the characterization of the waveform.

BRIEF SUMMARY OF THE INVENTION

The present invention is directed to acquiring data at a moderate sampling rate and to interpolate the data points in the time domain. The origin on the time axis is thus shifted to coincide with the echo peak. The method is accomplished by sampling at a rate adequate to characterize the waveform, commencing the sampling decidedly prior in time to the echo peak. The data obtained is then Fourier transformed to yield a trial frequency domain spectrum. The (frequency domain) data set is extended by adding zero amplitude datums in the positive and negative frequency directions, thereby obtaining a (frequency domain) data set enlarged by a factor $2^k$, k chosen typically as 1, 2, 3, ... etc. The enlarged frequency domain spectrum is then inverse Fourier transformed to yield an interpolated time domain waveform of correspondingly higher density of data points. The time origin is then shifted by selecting that datum corresponding to the echo peak position, based upon criteria which may be determined, for example, by analysis of the first Fourier transformed spectrum. The new time domain data set is reduced in density by selecting one of each k consecutive datums (to preserve the original spectral dynamic range) and this time shifted time domain data set is again transformed to the frequency domain to obtain a corrected frequency spectrum.

The invention is readily applied to wide line data such as are commonly obtained from solid samples.

BRIEF DESCRIPTION OF THE FIGURES

FIG. 2 schematically shows a pulse sequence and resonant spin echo.

FIG. 3 shows data processing.

DETAILED DESCRIPTION OF THE INVENTION

Figure 1:
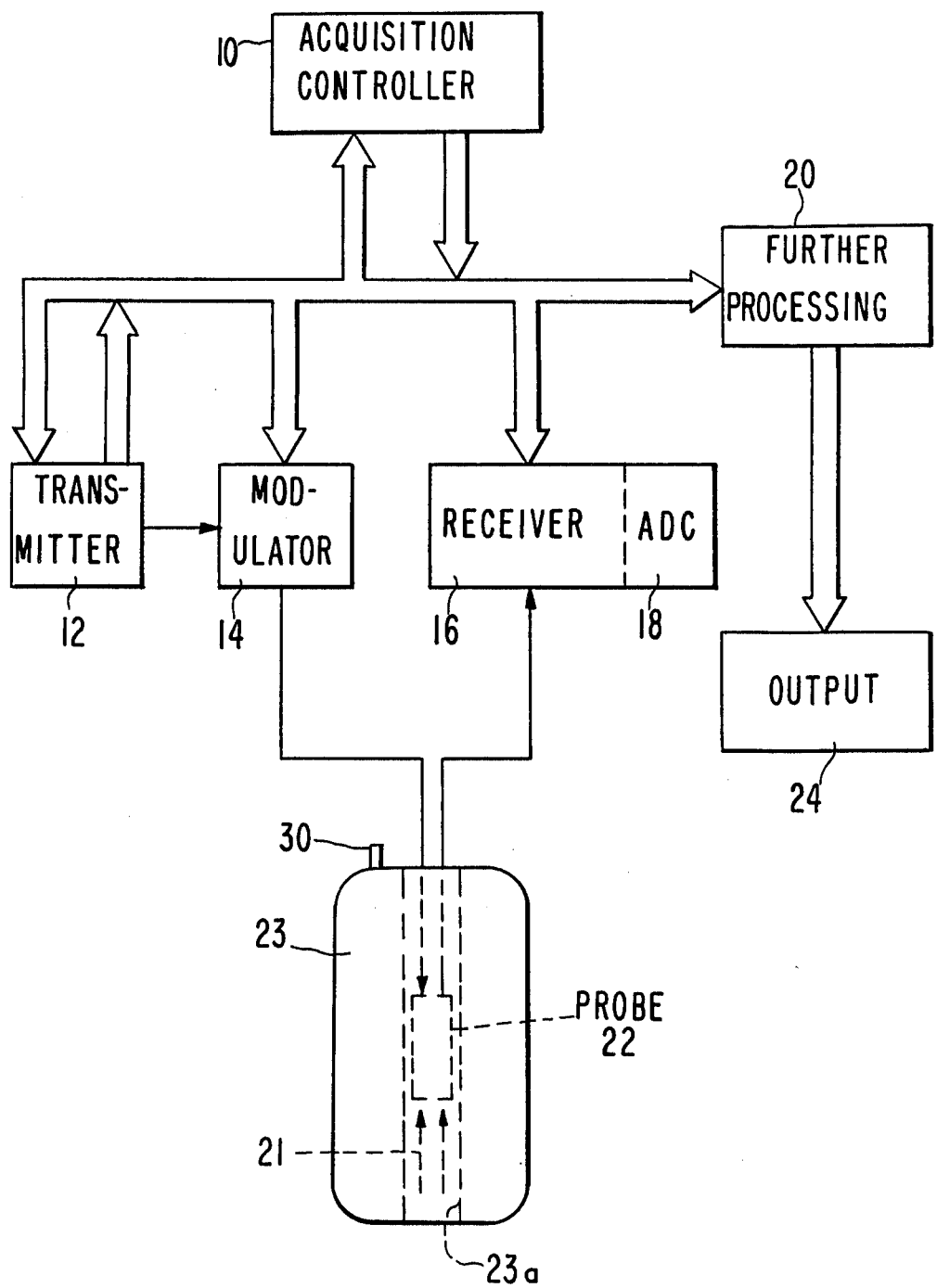
FIG. 1 schematically illustrates portions of an NMR apparatus.

Portions of a typical NMR data acquisition instrument are schematically illustrated in FIG. 1. An acquisition/control.processer 10 communicates with an RF transmitter 12, modulator 14 and receiver 16, including ADC 18 and further processor 20. The modulated RF excitation power irradiates an object (not shown) in a magnetic field 21, through a probe assembly 22 and the transient RF response of the object is intercepted by probe 22 communicating with receiver 16. The response is typically of the form of a transient oscillatine signal, often referred to as the time domain waveform. This transient waveform is sampled at regular intervals and the samples digitized in ADC 18. The digitized time domain waveform is then subject to further processing in further processor 20. The nature of such processing may include averaging the time domain waveform with a number of similar such waveforms, and transformation of the time domain waveform to the frequency domain, yielding a distribution function at output device 24. The latter may take on any of a number of identities for the display or further analysis of the data.

Turning now to FIG. 2a, there is shown one typical pulse sequence for exciting spin echo signals. As a consequence of the DC magnetic field 21, nuclear spins precess with characteristic frequency. The $\theta$ pulse 30 coherently rotates the magnetization associated with the precessing spins through an angle $\theta$ with respect to the local magnetic field. The angle $\theta$ is often selected to be 90° to obtain maximum signal. The spin assembly progressively loses coherence (dephases) during an interval $\tau$ after which an appropriate re-focusing pulse 32 rotates the spin system in such a manner that the time dependence of the dephasing is reversed and the assembly of spins tends to reacquire coherence reaching a peak 34 after the elapse of another interval $\tau$. This re-phased spin assembly will again relax, radiating a transient RF signal which we refer to as the spin echo. Precision in processing of a spin echo signal depends upon the precision in locating the peak of the signal. In this respect, one refers now to the envelope of the signal which rises following the inverting pulse 32, reaches a peak and declines.

The precision to which the peak can be located depends upon a number of factors. One such factor is the sampling rate of the ADC 18. For a sufficiently high sampling rate, the density of points in the region of the extrema facilitates locating such peak position. However, the expense of an appropriate high rate ADC may not be justified in all such instruments. Moreover, it may not be known a priori whether the peak has been adequately located in any event.

FIG. 3 shows the manner in which data are processed. At module 40, the spin echo data, having been acquired and digitized by DC 18 are (after appropriate averaging) Fourier transformed in a further processor 20 and stored in ATABLE, a data table of N consecutive entries expressing a (trial) frequency spectrum. Processing module 42 simply adds zero-containing entries to ATABLE to yield BTABLE. BTABLE is identical to ATABLE except that k entries containing 0 are added symmetrically from entry $N+1$ to $N+2^{k-1}$ and from $-1$ to $-(N+2^{k-1})$. The quantity $k=N2^n$, where N is, as expressed above, the number of entries in the original data table. (It is understood that each of the N entries may express a single coordinate, or a coordinate pair for complex transforms. It is also understood that the N entries may be derived from a number of sampled points possibly augmented with null entries to provide a power of 2 or other appropriate radix for the discrete Fourier transform.) The consequence of adding these null entries is evident after processing module 44 acts to return the extended data set of BTABLE to the time domain forming CTABLE. The time domain data set contained in CTABLE is more dense in time than the originally acquired data from which ATABLE was obtained by Fourier transformation. The information content is not altered, but the additional inter mediate points represent interpolations of the original data, e.g., a pseudo-frequency of the data sampling operation (higher than originally employed) is effectively reproduced by this operation.

The time origin is selectable to a greater pseudo-precision and such selection is made according to appropriate criteria. That is, the table entry corresponding to the echo peak maximum is selected from the extended CTABLE and the data in respect to the selected time origin is treated as a set of N datums comprising every $k^{th}$ entry (to comport with the actual sampling rate) to yield CTABLE having the same time precision as the original data. These N table entries are then again Fourier transformed to yield a corrected frequency spectrum.

It should be apparent that the present invention yields a carefully interpolated frequency domain spectral line shape.

The procedure described may, if desired, be imbedded within an iterative process. Such may be desirable where the most simple criteria for shifting the time origin are not clearly applicable. A simple criteria is certainly the relative amplitude of the signal at the several interpolated points in the neighborhood of the trial peak. Where the relative amplitude does not furnish a clear choice for a shifted time origin, a succession of shifts, each leading to a transformed (time origin corrected) spectrum may be examined on a relative basis as an iterative process to ascertain the best choice of time origin shift.

Since many changes can be made in the above construction and many apparently widely differing embodiments of this invention could be made without departing from the scope thereof, it is intended that all matter contained in the above description or shown in the accompanying drawings shall be interpreted as illustrative and not in a limiting sense.

What is claimed is:

1. A method of minimizing frequency dependent phase shifts from NMR spin echo spectral data, comprising:
    acquiring spin echo time domain spectral data commencing before the maximum of an NMR spin echo signal, said step of acquiring characterized by a rate of acquisition sufficient to characterize the spectral range of said time domain spectral data in N datums,
    transforming said time domain spectral data to the frequency domain, thereby producing an uncorrected frequency domain spectrum,
    extending the range of said uncorrected frequency domain spectrum by adding k/2 datums of zero amplitude to each of the high and low frequency ends of said spectrum at regular intervals, $k/N = g^n$ and n an integer, whereby an extended uncorrected frequency domain spectrum is obtained,
    inversely transforming said extended uncorrected frequency domain spectrum to the time domain to obtain an extended density time domain spectrum,
    locating that datum corresponding to the peak of the echo signal on said extended density time domain spectrum and assigning to said datum the time coordinate $t=0$,
    identifying one of each k successive datums commencing with $t=0$ as the shifted time domain spectrum, and
    transforming said shifted time domain spectrum to the frequency domain whereby a corrected frequency domain spectrum is obtained.

2. The method of claim 1 wherein said step of acquiring includes annexing sufficient null datums to said spin echo signal such that said N datums include sufficient said null datums and N is a power of a desired radix g.

3. The method of claim 2 wherein $g=2$.

* * * * *